(12) United States Patent
Ohyanagi et al.

(10) Patent No.: US 6,570,240 B1
(45) Date of Patent: May 27, 2003

(54) SEMICONDUCTOR DEVICE HAVING A LATERAL BIPOLAR TRANSISTOR AND METHOD OF MANUFACTURING SAME

(75) Inventors: Takasumi Ohyanagi, Hamura (JP); Atsuo Watanabe, Hitachiota (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/649,616

(22) Filed: Aug. 29, 2000

(30) Foreign Application Priority Data

Feb. 21, 2000 (JP) .................................... 2000-048937

(51) Int. Cl.[7] ........................ H01L 29/00; H01L 27/082
(52) U.S. Cl. .................... 257/575; 257/556; 257/557; 257/558; 257/559; 257/560; 257/561; 257/562; 257/576; 438/202; 438/204; 438/234
(58) Field of Search ........................... 257/575, 576, 257/556–562, 347, 387, 388; 438/204, 236, 311, 327, 335, 202, 234, 316, 325

(56) References Cited

U.S. PATENT DOCUMENTS 5,523,602 A * 6/1996 Horiuchi et al. ............ 257/347
5,708,287 A * 1/1998 Nakagawa et al. ......... 257/350
5,763,931 A * 6/1998 Sugiyama ................... 257/506
6,028,344 A * 2/2000 Hashimoto .................. 257/587

OTHER PUBLICATIONS

R. Dekker et al., "An Ultra Low Power Lateral Bipolar Polysilicon Emitter Technology on SOI", IEDM, 1993, pp. 75–78.

G. Shahidi et al., "A Novel High–Performance Lateral Bipolar on SOI", IEDM, 1991, pp. 663–667.

* cited by examiner

Primary Examiner—Tom Thomas
Assistant Examiner—Donghee Kang
(74) Attorney, Agent, or Firm—Antonelli, Terry, Stout & Kraus, LLP

(57) ABSTRACT

In order to form a semiconductor device including a lateral bipolar transistor which is a match in the device performance for a vertical bipolar transistor, an electrically conductive film which is formed by filling a trench reaching a buried oxide film in an SOI substrate with an electrically conductive film is utilized for an emitter and/or a collector, whereby a bipolar transistor is formed through a simple process.

15 Claims, 16 Drawing Sheets

50⋯CONDUCTIVE FILM
60⋯EMITTER REGION
70⋯BASE REGION
100⋯SOI SUBSTRATE
101⋯BURIED OXIDE FILM

SEMICONDUCTOR DEVICE HAVING A LATERAL BIPOLAR TRANSISTOR AND METHOD OF MANUFACTURING SAME

BACKGROUND OF THE INVENTION

The present invention relates to a semiconductor device having a lateral bipolar transistor and a method of manufacturing the same.

In general, a bipolar transistor which is formed on an Si substrate or an SOI (Silicon On Insulator) substrate is formed in such a way as to have the vertical structure. Since the formation of the bipolar transistor in the vertical structure enables the base width to be thinned and also enables the junction area between an emitter and a base to be restricted roughly to the size of the active region, the high performance can be realized.

However, in order that the bipolar transistor may be formed in such a way as to have the vertical structure, an $n^+$ type buried layer becomes essential thereto. On the contrary, in the case where the SOI substrate is employed in order to obtain the n type buried layer, an Si layer in the region in which a device is intended to be formed is compelled to become thick. Then, while there have been made a plurality of proposals for forming a lateral bipolar transistor on the SOI substrate having a thin Si layer, the process thereof is complicated.

For example, in IEDM (IEDM 93, pp. 75 to 78) 1993, there is proposed a bipolar transistor which is formed in such a way that an N type collector drift region is determined on the basis of an oxide film mask; n type impurity ions having a high concentration are implanted to form a collector electrode; then, p type impurity ions are implanted to form a base region; then, the base region is subjected to the silicon etching with the oxide film, with which the collector drift region is defined, as a mask to form a narrow base region; then, n type polysilicon is deposited to form an emitter electrode. In addition thereto, a lateral bipolar transistor which is formed on an SOI substrate is also reported in IEDM 91, pp. 663 to 667.

However, in the structure in which the lateral bipolar transistor is conventionally formed on the SOI substrate, the manufacturing process is compelled to be complicated.

SUMMARY OF THE INVENTION

In the light of the foregoing, it is therefore one object of the present invention to provide a semiconductor device in which a lateral bipolar transistor which is a match in the device performance for a vertical bipolar transistor can be formed through a simple manufacturing process, and a method of manufacturing the same.

According to one aspect of the present invention, there is provided a semiconductor device, wherein an electrode which is formed by filling a trench reaching a buried oxide film in an SOI substrate with an electrically conductive film or a metallic film is utilized as an emitter electrode and/or a collector electrode to simplify the manufacturing process and to form a lateral bipolar transistor which is a match in the device performance for a vertical bipolar transistor.

P type impurity ions for example are implanted through the trench by utilizing the vapor phase diffusion method, the plasma doping method, the oblique ion implantation method or the like, whereby it is possible to form a very thin base layer which has the vertically uniform concentration distribution ranging from the surface of the SOI substrate to the buried oxide film. In addition, for the formation of an emitter layer, there may also be adopted the method wherein after the trench has been filled with n type polysilicon for example, the overall substrate is exposed to the high temperatures to diffuse n type impurities from n type polysilicon. In addition, there may also be adopted the method wherein by the phosphorus deposition method is utilized which is employed for a long time as the method of after having formed a base layer, carrying out doping with phosphorus or the like, after having formed an emitter region, a metallic film is filled therein.

In addition, for the formation of an emitter electrode and a collector electrode of the bipolar transistor, there is adopted the structure in which the trench is filled with an electrically conductive semiconductor film or metal, whereby a voltage can be applied which is vertically uniform from the surface of the substrate to the buried oxide film, which leads to the enhancement of the performance of the lateral bipolar transistor.

In addition, according to another aspect of the present invention, after having formed an interlayer insulating film, an emitter electrode and/or a collector electrode of the bipolar transistor are/is formed. As a result, since the above-mentioned processing does not exert an influence on the fine patterning of MOS transistors which are formed together with the lateral bipolar transistors on the SOI substrate, it is possible to form the lateral bipolar transistors together with the fine MOS transistors on the SOI substrate. Furthermore, the above-mentioned processing is carried out after the formation of the interlayer insulating film, whereby a metallic film can be employed for the emitter electrode and/or the collector electrode.

DESCRIPTION OF THE EMBODIMENTS

Figure 1:
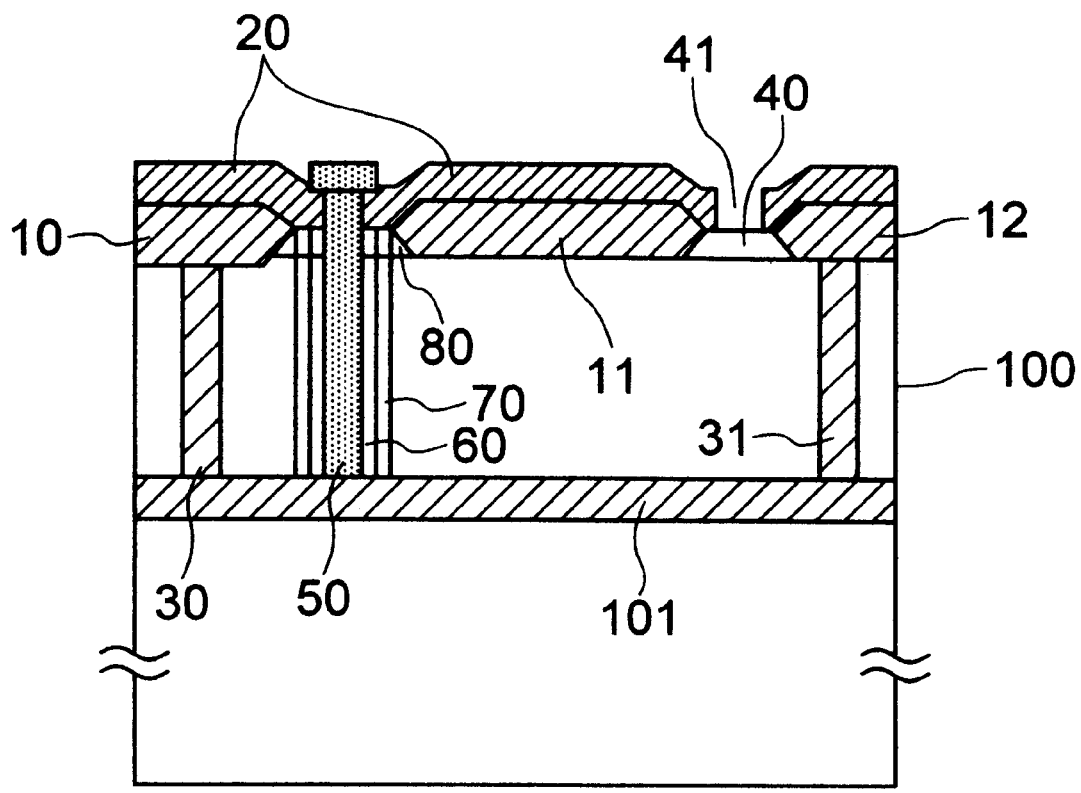
FIG. 1 is a longitudinal side elevational view showing the structure of a bipolar transistor according to a first embodiment of the present invention.

Embodiments of the present invention will hereinafter be described with reference to the accompanying drawings. The same or equivalent constituent means in the preferred embodiments are designated with the same reference numerals and the repeated description is omitted here for the sake of simplicity.

First Embodiment

FIG. 1 is a longitudinal side elevational view showing the structure of a bipolar transistor according to a first embodiment of the present invention.

This bipolar transistor is an NPN type bipolar transistor including: an emitter electrode which is formed by filling a trench reaching a buried oxide film 101 in the SOI substrate 100 through an interlayer insulating film 20 which is formed between an active region for a device which is formed on an n type SOI (Silicon On Insulator) substrate 100 having an Si layer with 1 to 2 $\mu$m or less thickness and a first level wiring with an electrically conductive film 50 such as an n type polysilicon film; and a uniform p type base layer 70 which is formed along the conductive film 50 thus filled thereon.

In the present embodiment, phosphorus for example is diffused from the conductive film (the n type polysilicon film) 50 into the SOI substrate 100 to form an n type emitter region 60, and an n type collector region 40 is formed on the surface of the SOI substrate 100.

By the way, in FIG. 1, reference numerals 10, 11 and 12 designates respectively field oxide films, reference numerals 30 and 31 designates respectively insulating films for isolation each of which is formed by filling the trench with an insulating material, reference numeral 41 designates a contact hole for a collector, and reference numeral 80 designates a high impurity concentrated region for a base contact.

In addition, the contact structure defined between the base region and a metal wiring will be described later in a fifth embodiment.

While the present embodiment adopts the structure employing the n type SOI substrate 100, it is to be understood that a p type emitter electrode is formed by employing a p type SOI substrate, whereby a PNP type transistor may also be formed similarly to the above-mentioned embodiment.

Second Embodiment

Figure 2:
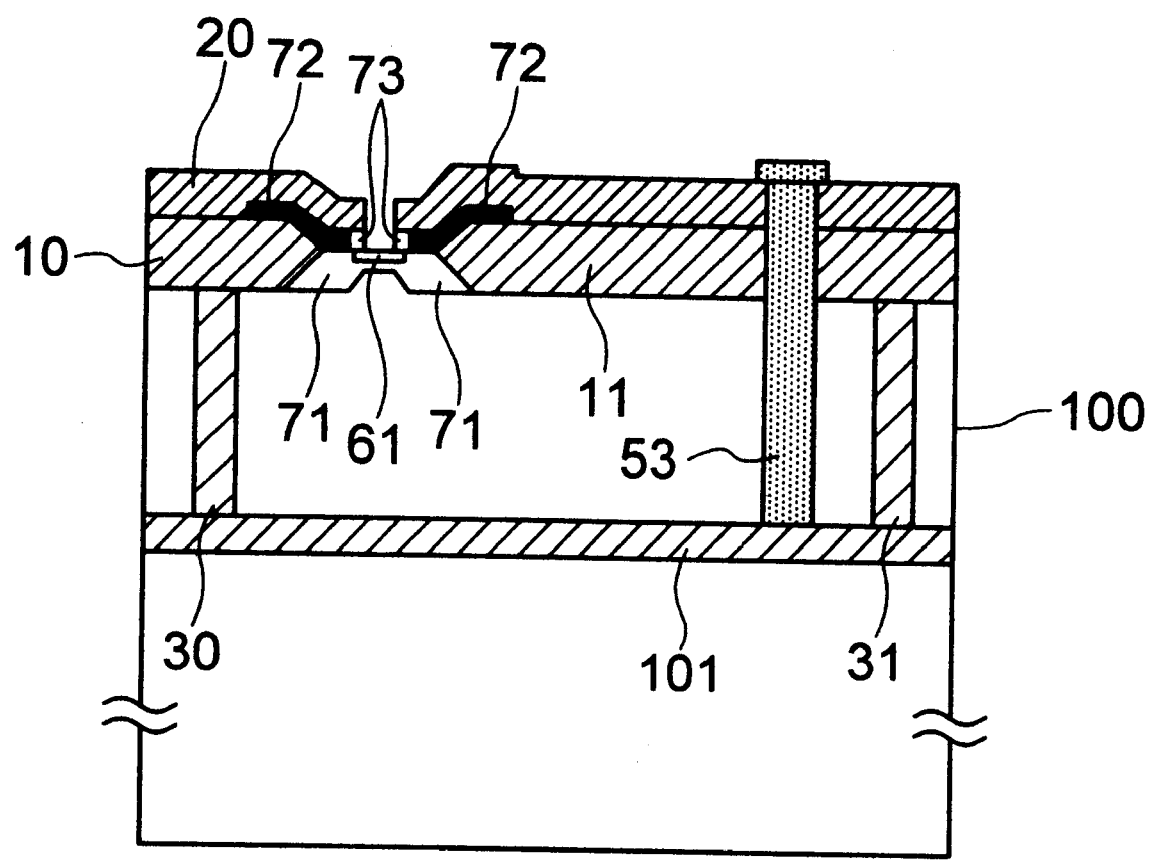
FIG. 2 is a longitudinal side elevational view showing the structure of a bipolar transistor according to a second embodiment of the present invention.

FIG. 2 is a longitudinal side elevational view showing the structure of a bipolar transistor according to a second embodiment of the present invention.

This bipolar transistor is an NPN type bipolar transistor including: a collector electrode which is formed by filling a trench reaching a buried oxide film 101 in the SOI substrate 100 through an interlayer insulating film 20 which is formed between the active region for a device which is formed on the n type SOI substrate 100 and the first level wiring with an electrically conductive film 53 such as an n type polysilicon film.

In the present embodiment, a p type base region 71 is formed by utilizing the diffusion of the impurities from a p type polysilicon film 72 thereinto. In addition, n type impurity ions such as arsenic ions are implanted with a sidewall 73 made of an insulating film, which is formed on the sidewall face of the p type polysilicon film 72, as a mask, thereby forming an n type emitter region 61.

By the way, reference numerals 10 and 11 designate respectively field oxide films, reference numeral 20 designates an interlayer insulating film, and reference numerals 30 and 31 designate respectively insulating films for isolation.

While the present embodiment adopts the structure employing the n type SOI substrate 100, it is to be understood that a p type collector electrode is formed by employing a p type SOI substrate, whereby a PNP type transistor may also be formed similarly to the above-mentioned embodiment.

Third Embodiment

FIGS. 3a to 3i show, in the order of the processes, the preferred process (method) of manufacturing the bipolar transistor which has been described in the first embodiment of the present invention.

Figure 3A:
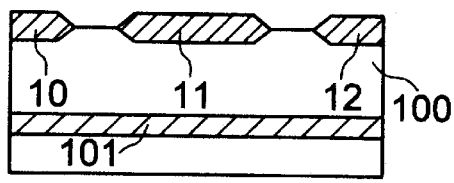
FIGS. 3a to 3i are respectively longitudinal side elevational views showing a third embodiment of the present invention and showing manufacturing processes (method) for realizing the bipolar transistor according to the first embodiment.

In Process Shown in FIG. 3a

The field oxide films 10, 11 and 12 are respectively formed on the n type SOI substrate 100 by utilizing the well known process.

Figure 3F:
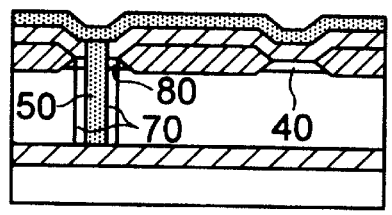
Figure 3B:
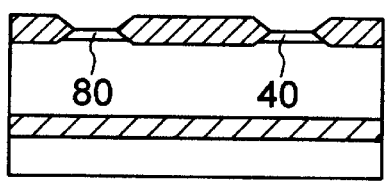

In Process Shown in FIG. 3b

P type impurity ions such as boron ions are implanted into the region, in which the base is intended to be formed, in such a way as to have the concentration by which the ohmic contact can be obtained with a metallic film to form the p type region 80, and also n type impurity ions such as arsenic ions are implanted into the region in which the collector is intended to be formed to form the n type region 40.

Figure 3G:
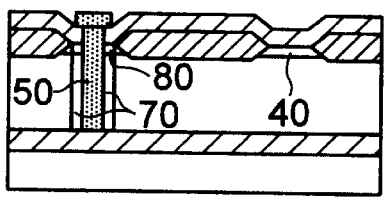
Figure 3C:
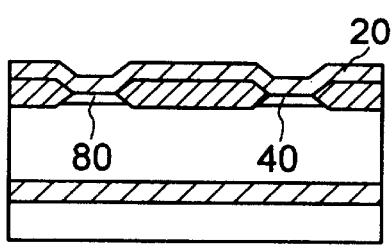

In Process Shown FIG. 3c

A silicon oxide film for example is deposited to the substrate body by utilizing the CVD method to form the interlayer insulating film 20.

Figure 3H:
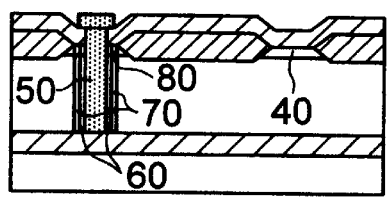
Figure 3D:
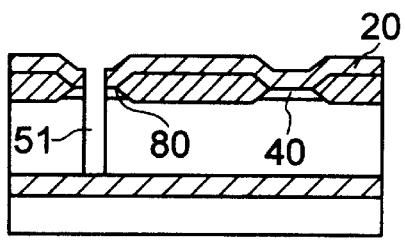

In Process Shown in FIG. 3d

The trench 51 is formed in such a way as to pass through the interlayer insulating film 20 and the silicon substrate part of the SOI substrate 100 to reach the buried oxide film 101 in the SOI substrate 100.

Figure 3I:
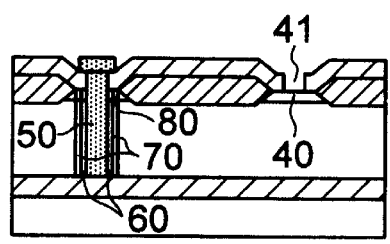
Figure 3E:
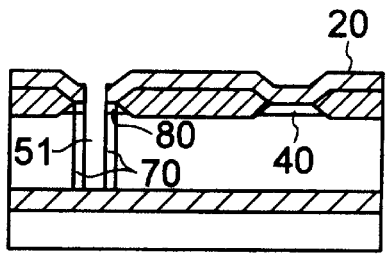

In Process Shown in FIG. 3e

Boron is diffused in such a way that its vertical concentration in the trench 51 becomes uniform by utilizing the vapor phase diffusion method or the plasma doping method to form the p type base layer 70.

In Process Shown in FIG. 3f

The n type polysilicon film 50 which has been doped with phosphorus for example is deposited to fill in the trench 51.

In Process Shown in FIG. 3g

The unnecessary region of the polysilicon film 50 is removed by utilizing the dry etching method for example to leave the polysilicon film 50 only in the region in which the emitter is intended to be formed which polysilicon film thus left is filled in the trench 51.

In Process Shown in FIG. 3h

The annealing is carried out in the nitrogen ambient atmosphere to exude phosphorus from the polysilicon film 50 which has been doped with phosphorus to form the n type emitter region 60.

In Process Shown in FIG. 3i

The contact hole 41 is formed through the, interlayer insulating film 20 in order to form the collector electrode, and also a contact hole (not shown) is formed in such a way that the contact with the base region 80 can be obtained therethrough. Thereafter, the metal wiring is formed by utilizing the well known wiring process to complete the process of manufacturing the bipolar transistor.

Fourth Embodiment

FIGS. 4a to 4j show, in the order of the processes, the preferred process (method) of manufacturing the bipolar transistor which has been described in the second embodiment of the present invention.

Figure 4A:
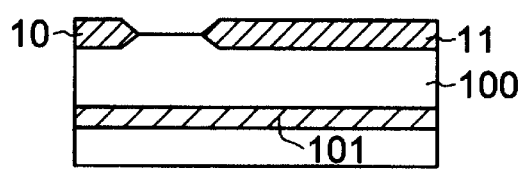
FIGS. 4a to 4j are respectively longitudinal side elevational views showing a fourth embodiment of the present invention and showing a part of manufacturing processes (method) for realizing the bipolar transistor according to the second embodiment.

In Process Shown in FIG. 4a

The field oxide films 10 and 11 are respectively formed on the n type SOI substrate 100 by utilizing the well known process.

Figure 4F:
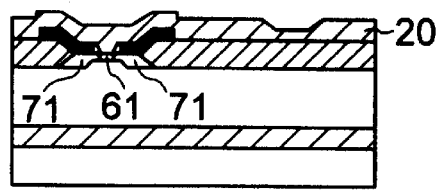
Figure 4B:
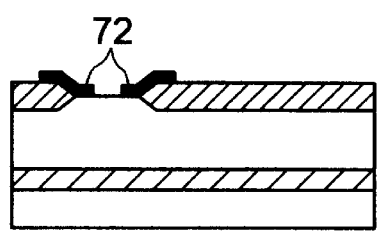

In Process Shown in FIG. 4b

The polysilicon film is deposited and then selectively etched away to form the polysilicon film 72 which has been doped with boron for example.

Figure 4G:
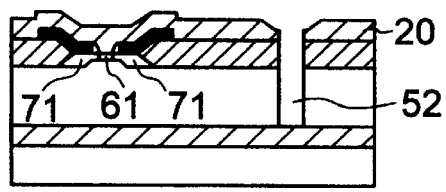
Figure 4C:
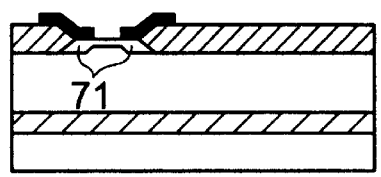

In Process Shown in FIG. 4c

The annealing is carried out in the nitrogen ambient atmosphere to diffuse boron from the polysilicon film 72 into the silicon substrate part of the SOI substrate 100 to form the base region 71.

Figure 4H:
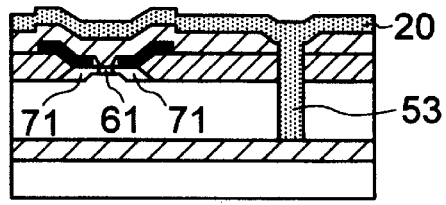
Figure 4D:
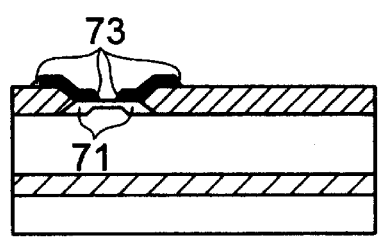

In Process Shown in FIG. 4d

The sidewall 73 made of a silicon oxide film is formed on the side end face of the polysilicon film 71.

Figure 4I:
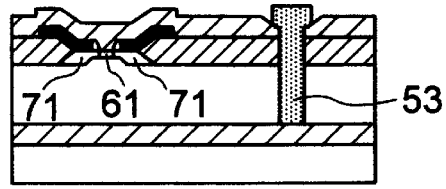
Figure 4E:
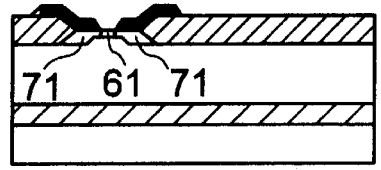

In Process Shown in FIG. 4e

Arsenic ions for example are implanted to form the emitter region 61.

In Process Shown in FIG. 4f

The silicon oxide film 20 for example is deposited by utilizing the CVD method.

In Process Shown in FIG. 4g

The trench 52 is formed.

In Process Shown in FIG. 4h

The n type polysilicon film 53 which has been doped with phosphorus for example is deposited to fill in the trench 52.

In Process Shown in FIG. 4i

The polysilicon film 53 is processed by utilizing the dray etching method for example in such a way that only an region which is required for the collector electrode is left.

Figure 4J:
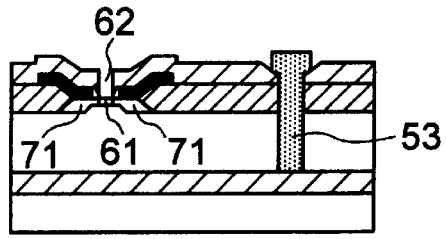

In Process Shown in FIG. 4j

The contact hole 62 for the emitter region 61 is formed, and also a contact hole (not shown) is formed in such a way that the contact with the polysilicon film 72 and the base region 71 can be carried out therethrough. Thereafter, the metal wiring is formed by utilizing the well known wiring process to complete the bipolar transistor.

With respect to this manufacturing process, the processes shown in FIGS. 4d and 4e may also be changed into the processes shown in FIGS. 5k to 5n. In this case, the processes shown in FIGS. 4a to 4c and the processes shown in FIGS. 4f to 4j are not changed at all.

Figure 5K:
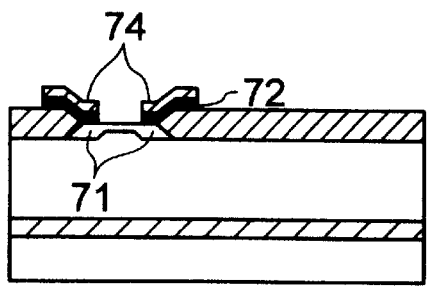
FIGS. 5k to 5n are respectively longitudinal side elevational views showing a fourth embodiment of the present invention and showing a modification of manufacturing processes (method) for realizing the bipolar transistor according to the second embodiment.

In Process Shown in FIG. 5k

After the base region 71 has been formed by utilizing the diffusion of the impurities from the p type polysilicon film 72 in the process shown in FIG. 4c, a silicon oxide film is deposited by utilizing the CVD method or the like and then this silicon oxide film is processed to form the silicon oxide film 74 with which the p type polysilicon layer 72 is covered.

Figure 5L:
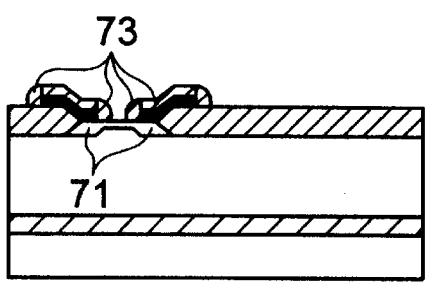

In Process Shown in FIG. 5l

After the silicon oxide film has been deposited by utilizing the CVD method or the like, the etchback is carried out therefor to form the sidewall 73, made of the silicon oxide film, on the side end faces of the p type polysilicon film 72 and the silicon oxide film 74 formed on the p type polysilicon film 72.

Figure 5M:
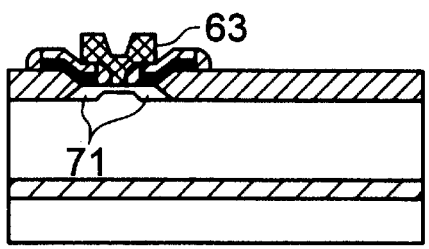

In Process Shown in FIG. 5m

After an n type polysilicon film which is doped with phosphorus has been deposited on the overall surface of the substrate body, this n type polysilicon film is selectively etched away to leave the necessary part thereof, thereby forming the polysilicon film 63.

Figure 5N:
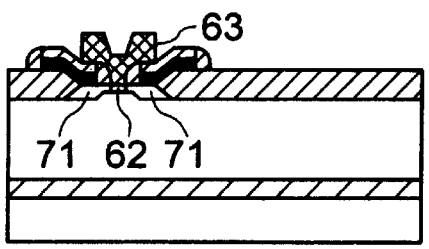

In Process Shown in FIG. 5n

The annealing is carried out in the nitrogen ambient atmosphere for example to diffuse phosphorus from the n type polysilicon film 63, thereby forming the emitter region 62.

Fifth Embodiment

Figure 6:
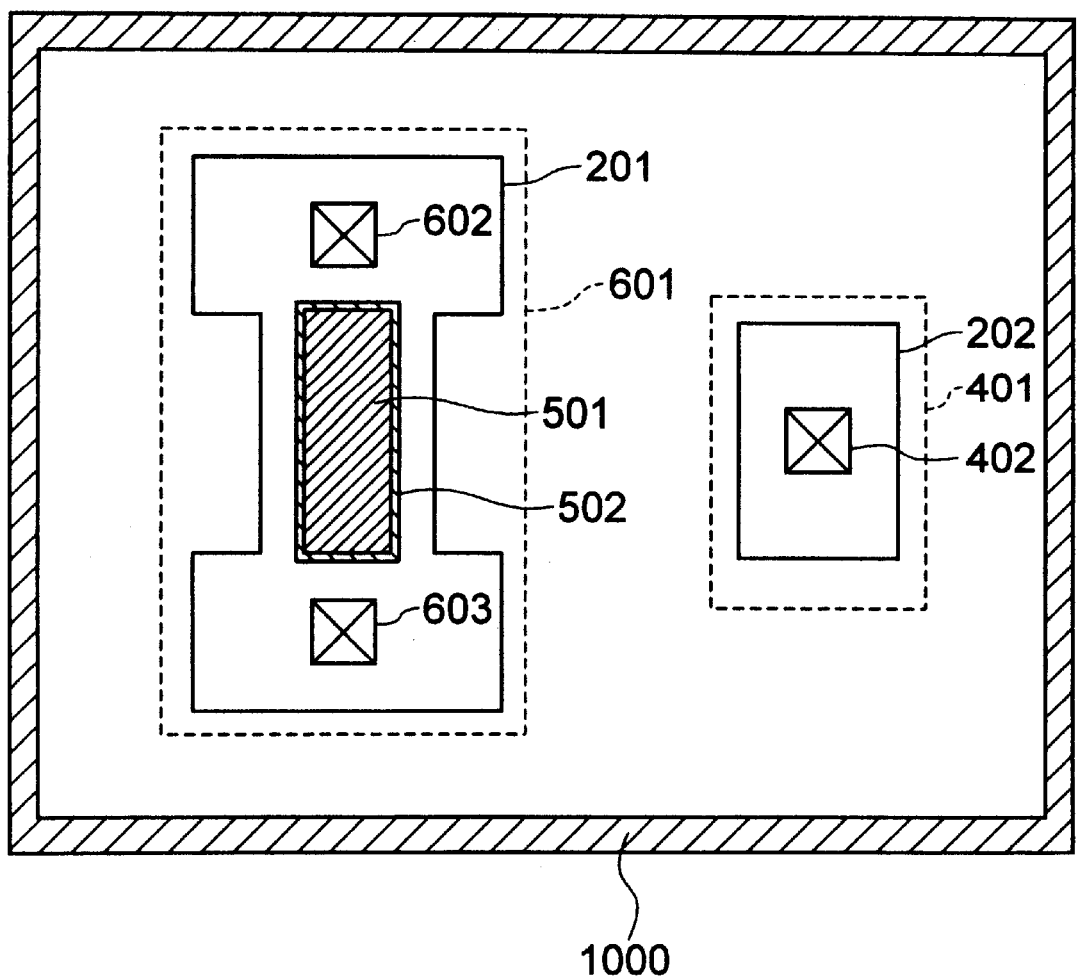
FIG. 6 is a plan view showing a fifth embodiment of the present invention and showing a layout pattern for realizing the bipolar transistor according to the first embodiment.

FIG. 6 shows a preferred layout pattern (which is obtained by making the individual mask patterns overlap each other) for the bipolar transistor which was described in the first embodiment of the present invention.

In the figure, reference numerals 201 and 202 designate respectively mask patterns which are used to define the active region of the device. The inner part thereof becomes the active region of the device. Reference numeral 401 designates a mask pattern which is used to form the collector region, and reference numeral 402 designates a mask pattern which is used to form the contact hole through the interlayer insulating film in order to form the collector region.

Reference numeral 601 designates a mask pattern which is used to form the high impurity concentrated region with which the contact with the base region is made the ohmic contact and through which the impurity ions having the same conductivity type as that of the impurities in the base region are implanted. Reference numerals 602 and 603 designate respectively mask patterns which are used to form the contact holes between the base region and the interlayer insulating film.

Reference numeral 501 designates a mask pattern which is used to form the trench, and reference numeral 502 designates a mask pattern which is used to process the electrically conductive film filling in the trench.

Reference numeral 1000 designates a mask pattern which is used to form the trench for isolation.

While in the present embodiment, the description made with reference to the associated figures is omitted, a mask pattern is also employed which is used to form the wiring pattern in such a way as for the wiring pattern to become in contact with the mask pattern for the contact holes and the mask pattern which is used to process the electrically conductive film filling in the trench.

Sixth Embodiment

Figure 7:
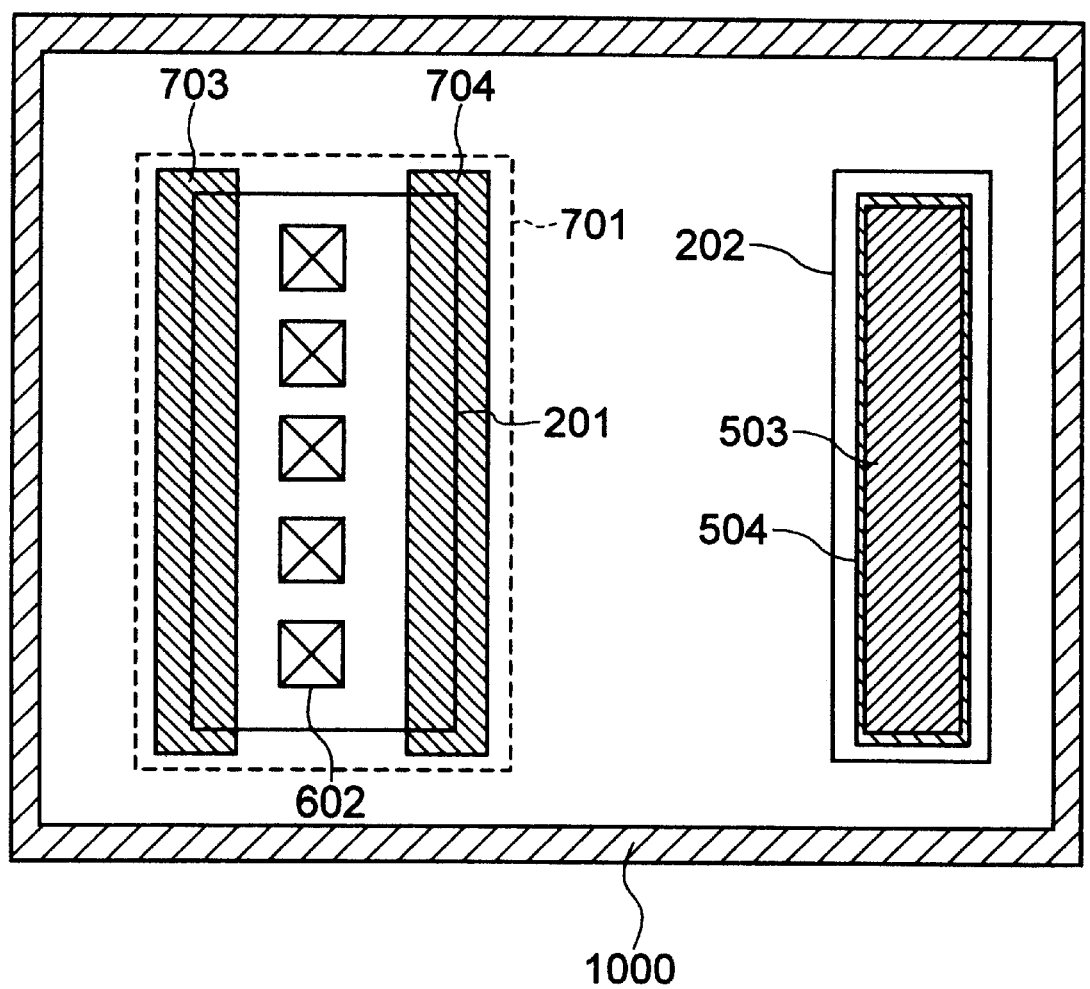
FIG. 7 is a plan view showing a sixth embodiment of the present invention and showing a layout pattern for realizing the bipolar transistor according to the second embodiment.

FIG. 7 shows a preferred layout pattern (which is obtained by making the individual mask patterns overlap each other) for the formation of the bipolar transistor which was described in the second embodiment of the present invention.

In the figure, reference numerals 201 and 202 designate respectively mask patterns which are used to define the active region of the device. The inner part thereof becomes the active region of the device. Reference numerals 703 and 704 designate respectively mask patterns which are used to define the region for the polysilicon film having the same conductivity type as that of the base layer to be formed. Reference numeral 701 designates a mask pattern which is used to form the emitter region, and reference numeral 602 designates a mask pattern which is used to form the contact holes through the interlayer insulating film in order to form the emitter region.

Reference numeral 503 designates a mask pattern which is used to form the trench in which the collector electrode is to be formed, and reference numeral 504 designates a mask pattern which is used to process the electrically conductive film filling in the trench.

Reference numeral 1000 designates a mask which is used to form the trench for isolation.

While in the present embodiment, the description made with reference to the associated figures is omitted, a mask pattern is also employed which is used to form the wiring pattern in such a way as for the wiring pattern to become in contact with the mask pattern for the contact holes and the mask pattern which is used to process the electrically conductive film filling in the trench.

Seventh Embodiment

Figure 8:
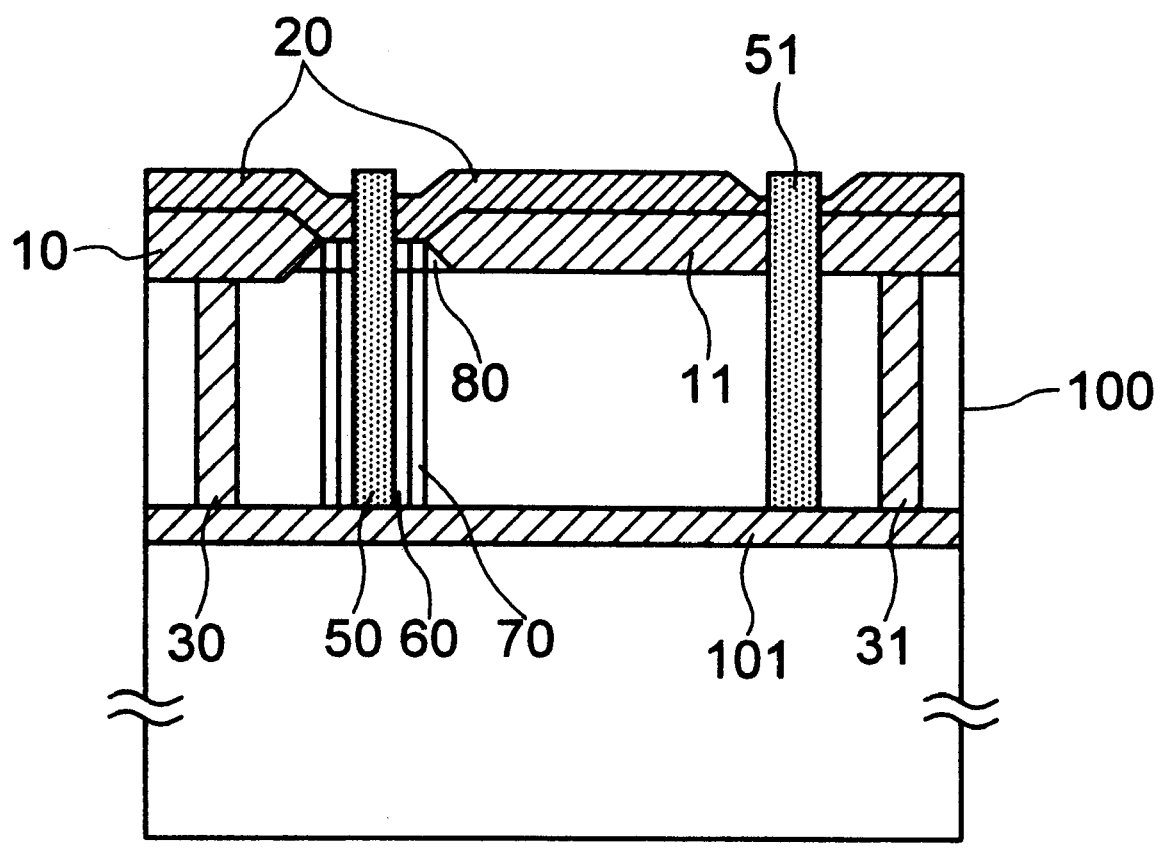
FIG. 8 is a longitudinal side elevational view showing the structure of a bipolar transistor according to a seventh embodiment of the present invention.

FIG. 8 is a longitudinal side elevational view showing the structure of a bipolar transistor according to a seventh embodiment of the present invention.

This bipolar transistor is an NPN type bipolar transistor including: an emitter electrode which is formed by filling a trench reaching a buried oxide film 101 of an n type SOI substrate 100 through an interlayer insulating film 20 formed between an active region of a device, which is formed on the SOI substrate 100, and a first level wiring with an electrically conductive film 50 such as an n type polysilicon film; and a collector electrode which is formed by filling a trench reaching the buried oxide film 101 of the SOI substrate 100 through a field oxide film formed between the active region of the device and the first level wiring, and the interlayer insulating film 20 with an electrically conductive film 51 such as an n type polysilicon film.

By the way, reference numeral 10 designates a field oxide film, reference numerals 30 and 31 designate respectively insulating films for isolation, reference numeral 60 designates an n type emitter region, reference numeral 70 designates a p type base layer, and reference numeral 80 designates a high impurity concentrated region for the base contact.

While the present embodiment has the structure in which the n type SOI substrate 100 is employed, it is to be understood that a p type SOI substrate is employed in order to form a p type collector electrode, whereby a PNP type bipolar transistor may also be formed similarly to the above-mentioned embodiments.

Eighth Embodiment

FIGS. 9a to 9j show, in the order of the processes, the preferred process of manufacturing the bipolar transistor which has been described in the seventh embodiment of the present invention.

Figure 9A:
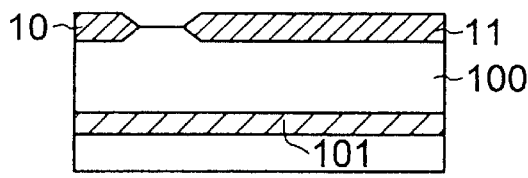
FIGS. 9a to 9j are respectively longitudinal side elevational views showing an eighth embodiment of the present invention and showing manufacturing processes (method) for realizing the bipolar transistor according to the seventh embodiment.

In Process Shown in FIG. 9a
The field oxide films 10 and 11 are respectively formed on the n type SOI substrate 100.

Figure 9F:
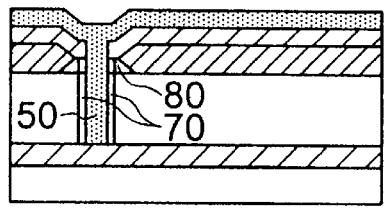
Figure 9B:
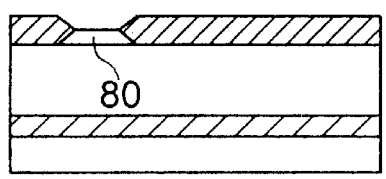

In Process Shown in FIG. 9b
Boron ions for example are implanted to form the high impurity concentrated p type region 80.

Figure 9G:
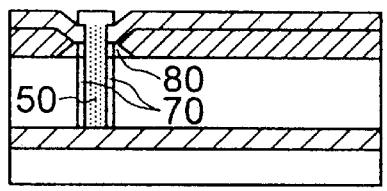
Figure 9C:
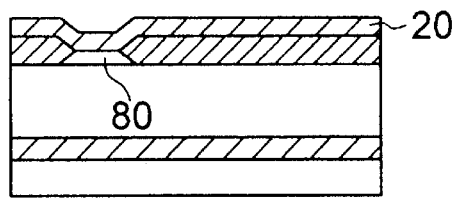

In Process Shown in FIG. 9c
The silicon oxide film (the interlayer insulating film) 20 is deposited by utilizing the CVD method for example.

Figure 9H:
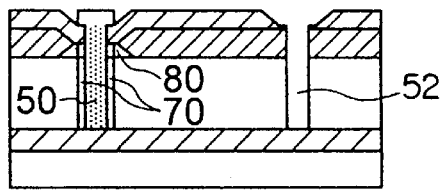
Figure 9D:
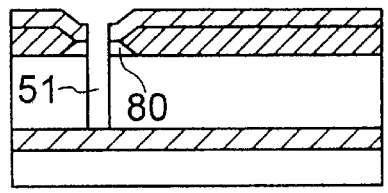

In Process Shown in FIG. 9d
The trench 51 is formed.

Figure 9I:
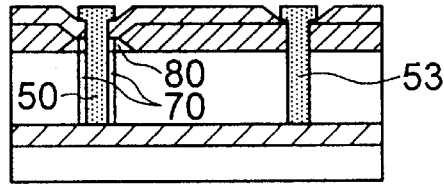
Figure 9E:
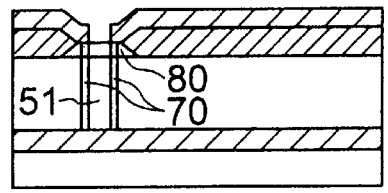

In Process Shown in FIG. 9e
Boron is diffused by utilizing the vapor phase diffusion method, the plasma doping method or the like to form the p type base region 70.

In Process Shown in FIG. 9f
The n type polysilicon film 50 which has been doped with phosphorus for example is deposited to fill in the trench.

In Process Shown in FIG. 9g
The unnecessary region of the polysilicon film 50 is selectively etched away by utilizing the dry etching method for example.

In Process Shown in FIG. 9h
The trench 52 is formed.

In Process Shown in FIG. 9i
After the n type polysilicon film 53 which is doped with phosphorus for example has been deposited to fill in the trench, the unnecessary region of the n type polysilicon film 53 is etched away by utilizing the dry etching for example.

Figure 9J:
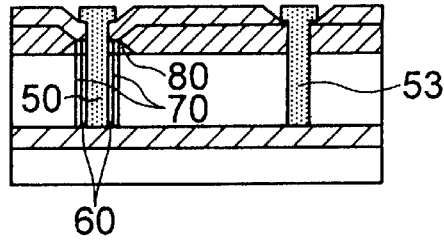

In Process Shown in FIG. 9j
The annealing is carried out in the nitrogen ambient atmosphere for example to exude phosphorus from the polysilicon film 50 filling in the trench into the silicon substrate part of the SOI substrate 100 to form the n type region 60, thereby completing the bipolar transistor.

Ninth Embodiment

FIGS. 10a to 10h show, in the order of the processes, the preferred process of manufacturing a semiconductor device in which the bipolar transistor which was described in the first embodiment of the present invention and an n-channel MOS transistor are both formed on one chip.

Figure 10A:
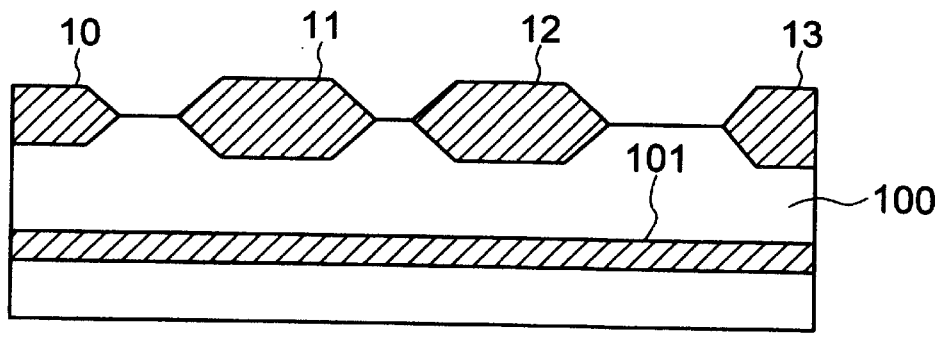
FIGS. 10a to 10h are respectively longitudinal side elevational views showing a ninth embodiment of the present invention and showing a part of manufacturing processes (method) for forming the bipolar transistor of the first embodiment and an n-channel MOS transistor on one chip.

In Process Shown in FIG. 10a
The field oxide films 10, 11, 12 and 13 are respectively formed on the n type SOI substrate 100.

Figure 10B:
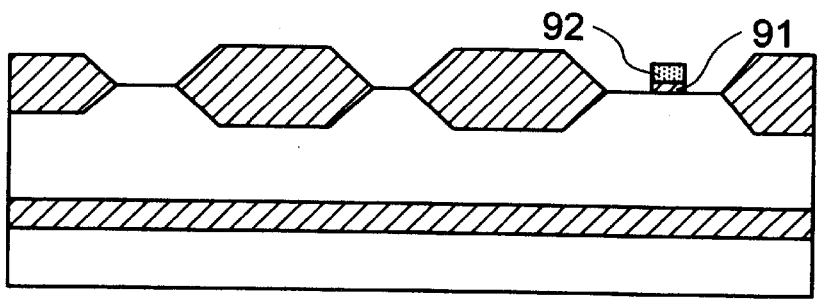

In Process Shown in FIG. 10b
A thermal oxide film and a polysilicon film which has been doped with the n type impurities are deposited to be processed by utilizing the dry etching method for example, whereby a gate oxide film 91 and a gate electrode 92 which are the constituent elements of the n-channel MOS transistor are respectively formed.

Figure 10C:
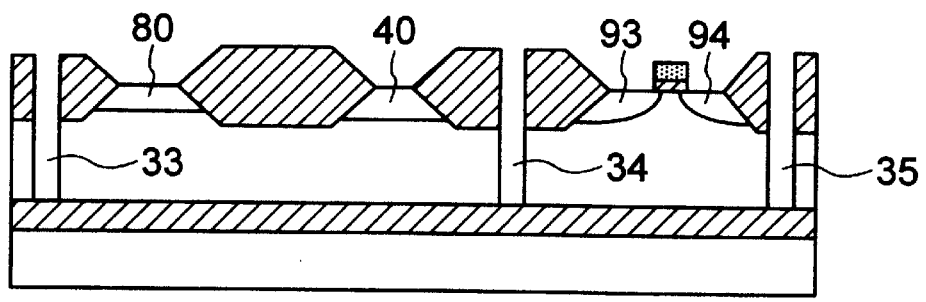

In Process Shown in FIG. 10c
Boron ions for example are implanted into the region in which the bipolar transistor is intended to be formed to form the high impurity concentrated p type region 80. In addition, arsenic ions for example are implanted to form both of the high impurity concentrated n type region 40 for the collector electrode of the bipolar transistor, and a source electrode 93 and a drain electrode 94 of the n-channel MOS transistor.

Also, trenches 33, 34 and 35 for isolation are respectively formed.

Figure 10D:
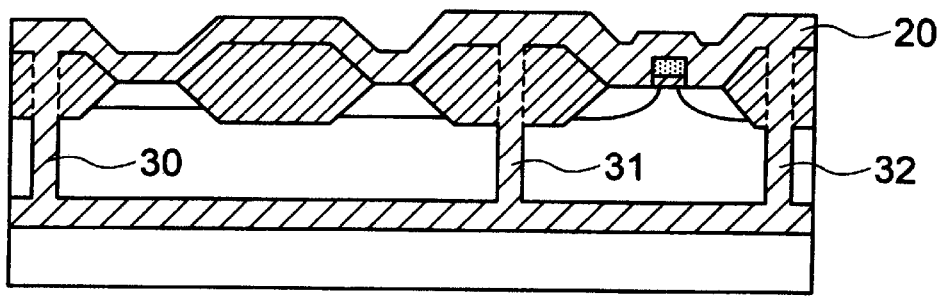

In Process Shown in FIG. 10d
The silicon oxide film is deposited by utilizing the CVD method for example to fill in the trenches 33, 34 and 35 to form the insulating films for isolation 30, 31 and 32 and also to form the interlayer insulating film 20 between the active region of the device and the first level wiring.

Figure 10E:
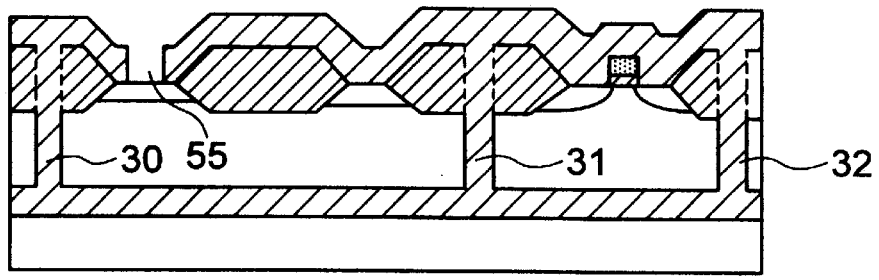

In Process Shown in FIG. 10e

The interlayer insulating film 20 is processed with a photo resist pattern as a mask to form a groove 55 for the formation of the trench.

Figure 10F:
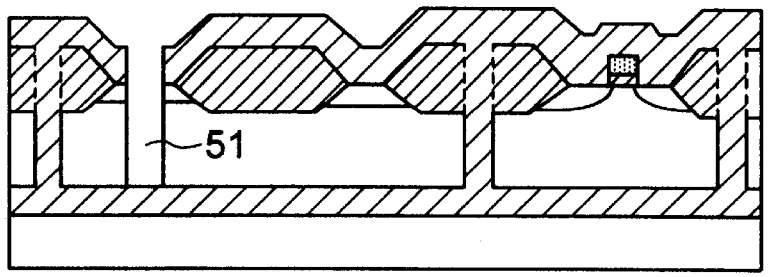

In Process Shown in FIG. 10f

After photo resist has been removed, a trench 51 is formed through the silicon substrate part with the interlayer insulating film 20 as a mask.

Figure 10G:
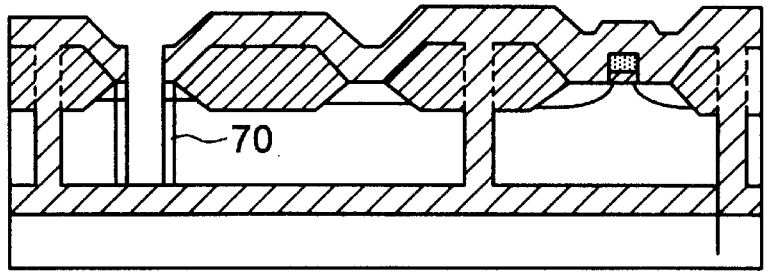

In Process Shown in FIG. 10g

Boron ions are implanted by utilizing the vapor phase diffusion method, the plasma doping method or the like to form the base region 70 of the bipolar transistor.

Figure 10H:
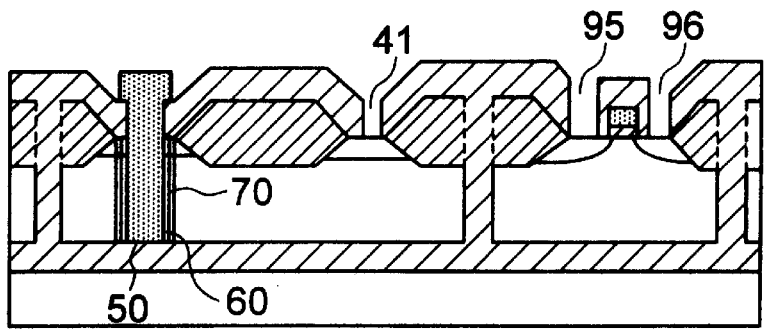

In Process Shown in FIG. 10h

After an n type polysilicon film or the like is deposited to fill in the trench 51, the processing of removing the unnecessary part of the n type polysilicon film is carried out to form the electrically conductive film 50 within the trench 51. In addition, the contact holes 41, 95 and 96 for the formation of the collector electrode of the bipolar transistor, and a source electrode and a drain electrode of the n-channel MOS transistor are formed.

Thereafter, the metal wiring is formed by utilizing the well known wiring process to complete the bipolar transistor.

While in the present embodiment, the description has been given with respect to the semiconductor device in which the bipolar transistor which was described in the first embodiment of the present invention and the n-channel MOS transistor are both formed on one chip, the present invention may also be implemented with respect to the bipolar transistor which was described in the second or seventh embodiment similarly to the present embodiment. In addition, the present invention may also be implemented with respect to a p-channel MOS transistor and a CMOS transistor as well as the n-channel MOS transistor.

Tenth Embodiment

FIGS. 11a to 11h show, in the order of the processes, the preferred process of manufacturing a semiconductor device in which the bipolar transistor which was described in the first embodiment of the present invention and a high-voltage withstanding lateral n-channel MOS transistor are both formed on one chip.

Figure 11A:
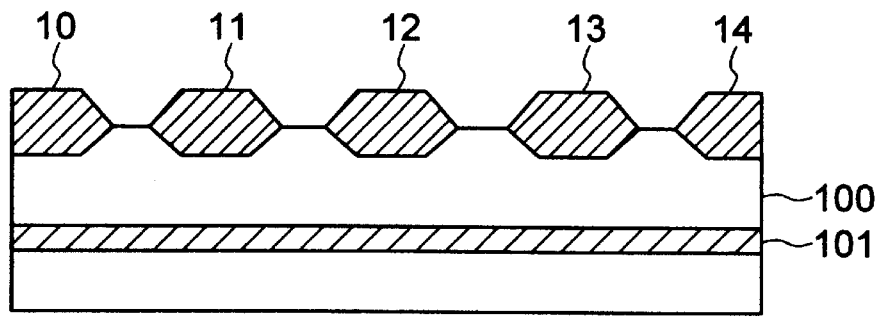
FIGS. 11a to 11h are respectively longitudinal side elevational views showing a tenth embodiment of the present invention and showing a part of manufacturing processes (method) for forming the bipolar transistor of the first embodiment and a high-voltage withstanding n-channel MOS transistor on one chip.

In Process Shown in FIG. 11a

The field oxide films 10, 11, 12, 13 and 14 are respectively formed on the n type SOI substrate 100.

Figure 11B:
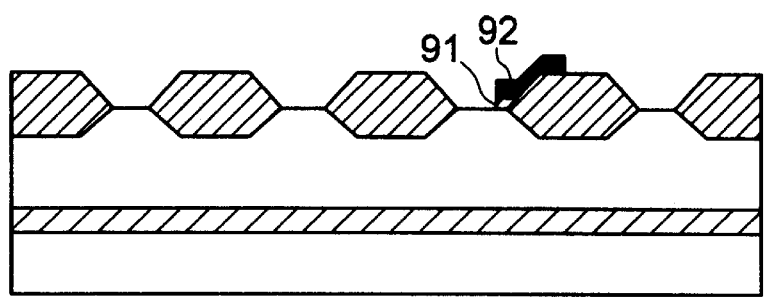

In Process Shown in FIG. 11b

The thermal oxide film and the polysilicon film which has been doped with n type impurities are deposited to be processed by utilizing the dry etching method for example, whereby the gate oxide film 91 and the gate electrode 92 of the high-voltage withstanding n-channel MOS transistor are both formed.

Figure 11C:
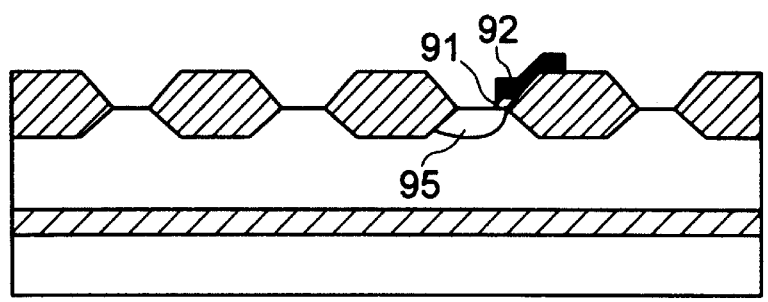

In Process Shown in FIG. 11c

After p type impurity ions such as boron ions have been implanted into the region in which the high-voltage withstanding n-channel MOS transistor is intended to be formed, the diffusion is carried out at 1100° C. for about several tens to about several hundreds minutes to form a deep p type impurity region 95.

Figure 11D:
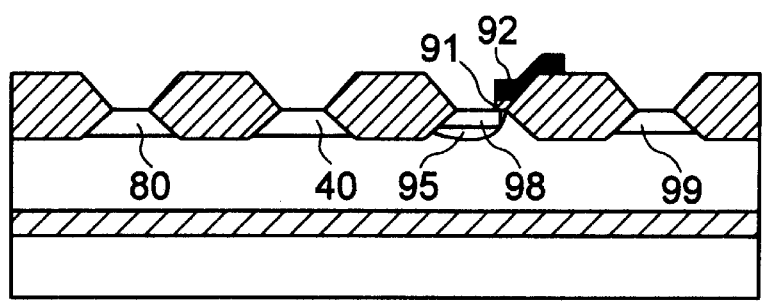

In Process Shown in FIG. 11d

Impurity ions such as boron ions are implanted into the region in which the bipolar transistor is intended to be formed to form a high impurity concentrated p type region 80 and to form a high impurity concentrated n type region 40 for the collector electrode of the bipolar transistor. In addition, impurity ions such as arsenic ions are implanted into the source region and the drain region of the high-voltage withstanding n-channel MOS transistor to form high impurity concentrated n type regions 98 and 99, respectively.

Figure 11E:
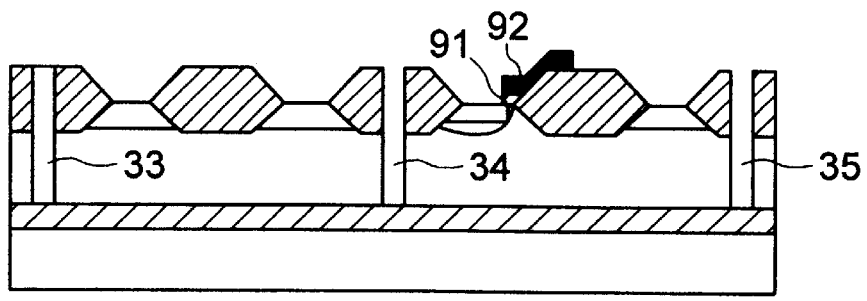

In Process Shown in FIG. 11e

Trenches 33, 34 and 35 for isolation are respectively formed.

Figure 11F:
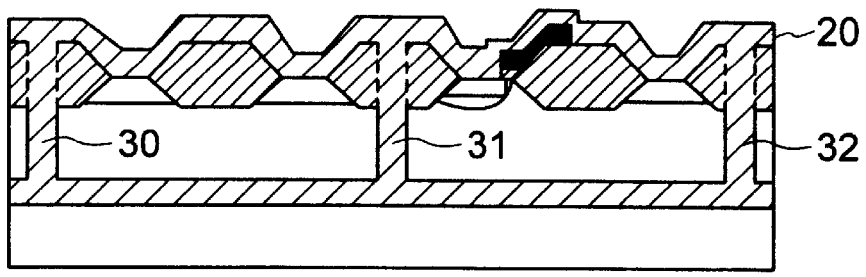

In Process Shown in FIG. 11f

A silicon oxide film is deposited by utilizing the CVD method for example to fill in the trenches 33, 34 and 35 to form insulating films for isolation 30, 31 and 32 and to form an interlayer insulating film 20 between the active region of the device and the first level wiring.

Figure 11G:
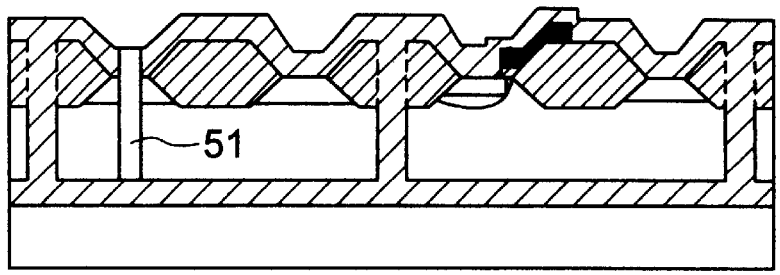

In Process Shown in FIG. 11g

A trench 51 is formed through the silicon substrate part of the SOI substrate 140.

Figure 11H:
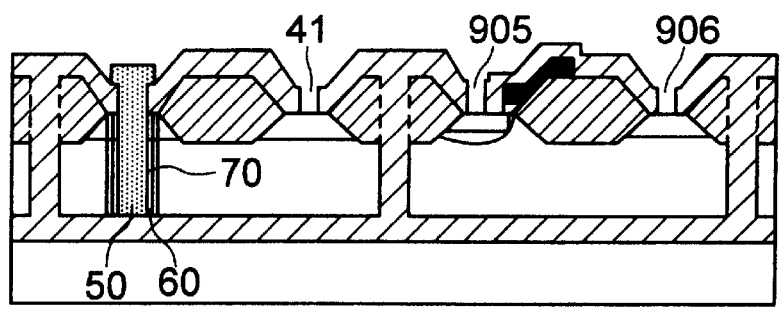

In Process Shown in FIG. 11h

Boron ions are implanted by utilizing the vapor phase diffusion method, the plasma doping method or the like to form the base region 70 of the bipolar transistor. Thereafter, an n type polysilicon film or the like is deposited to fill in the trench 51 to be processed, thereby forming an n type polysilicon film 50. Then, the annealing is carried out therefor to exude phosphorus from the n type polysilicon film 50 to form the emitter region 60. In addition, contact holes 41, 905 and 906 for the formation of the collector electrode of the bipolar transistor, and the source electrode and the drain electrode of the high-voltage withstanding n-channel MOS transistor are respectively formed.

Thereafter, the metal wiring is formed by utilizing the well known wiring process to complete the semiconductor device.

While in the present embodiment, the description has been given with respect to the semiconductor device in which the bipolar transistor which was described in the first embodiment of the present invention and the high-voltage withstanding n-channel MOS transistor are both formed on one chip, the present invention may also be implemented with respect to the bipolar transistor which was described in the second or seventh embodiment similarly to the present embodiment. In addition, the present invention may also be implemented with respect to high-voltage withstanding devices such as a high-voltage withstanding p-channel MOS transistor and an IGBT as well as the high-voltage withstanding n-channel MOS transistor.

With respect to the bipolar transistor according to the present invention, the contact position of the collector is set in various ways, whereby the distance of the collector drift region which leads from the emitter electrode to the collector electrode can be set in various ways, and also the withstanding voltage of the bipolar transistor can be controlled depending on only the distance of the drift region.

Eleventh Embodiment

Figure 12:
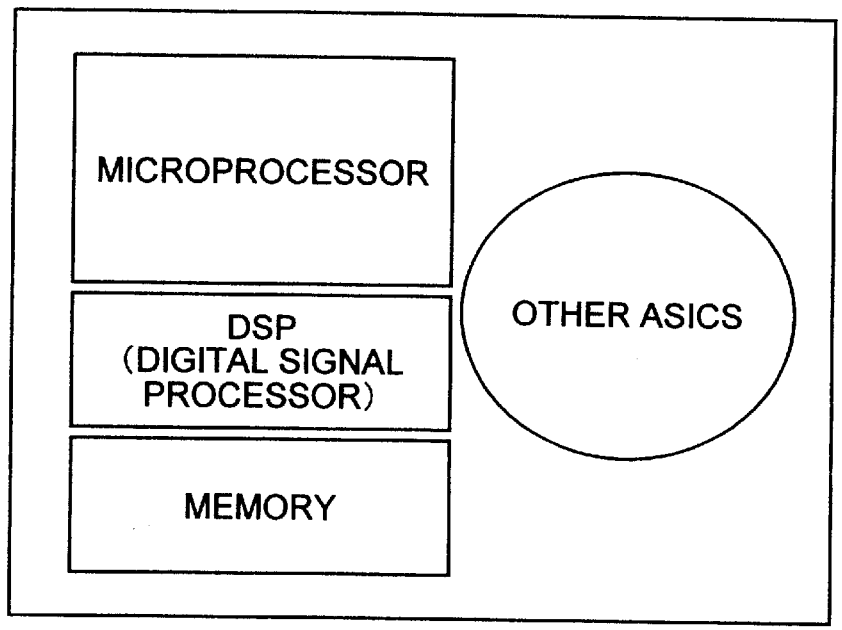
FIG. 12 is a block diagram showing an eleventh embodiment of the present invention and showing a configuration of a system LSI to which the bipolar transistor is applied.

FIG. 12 is a block diagram showing a configuration of a system LSI. In general, a DRAM or an SRAM is employed as a memory unit. In this memory unit, the bipolar transistor of the present invention is applied to a sense amplifier unit and a decoder circuit unit, whereby both low cost and high speed operation can be realized. In addition, a driver circuit in which the high driving ability of the bipolar transistor is utilized is selectively used in a circuit, for generating a voltage for a high accuracy reference power source, employing the bipolar transistor or in a part having a large load capacity, whereby the high speed operation of the system LSI can be realized.

In addition, since for the bipolar transistor of the present invention, only by adding the process of forming a trench electrode between the process of forming an interlayer insulating film and the process of forming a wiring, the high performance bipolar transistor can be realized, the simplification of the process can be realized, the bipolar transistor can be readily manufactured together with the fine MOS transistor, and this configuration can contribute to the promotion of the high performance of the system LSI.

Twelfth Embodiment

Figure 13:
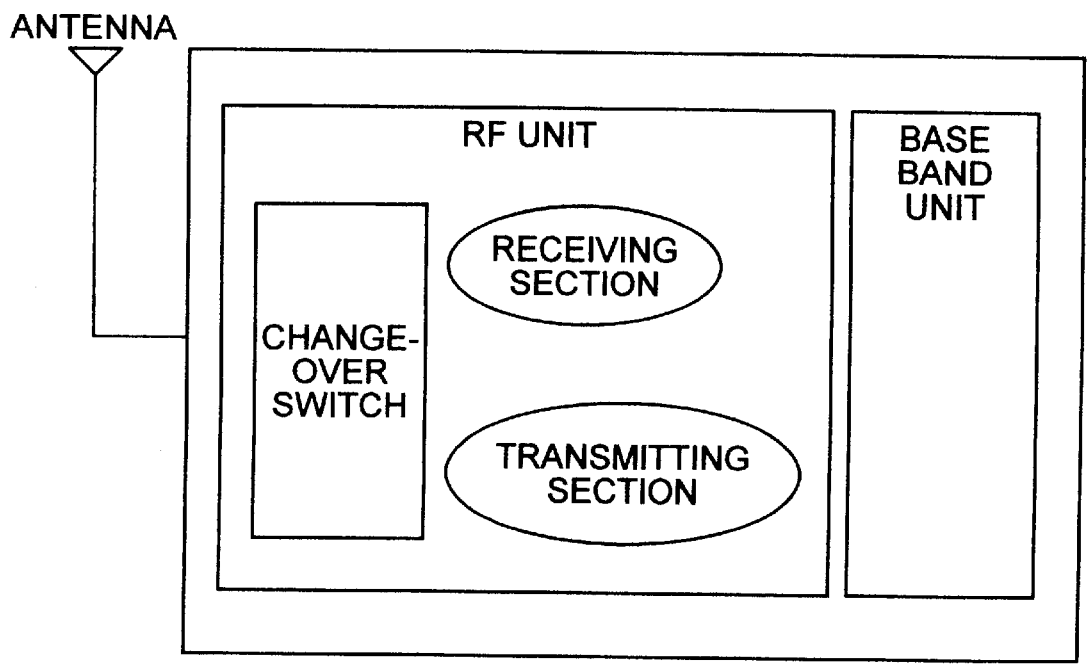
FIG. 13 is a block diagram showing a twelfth embodiment of the present invention and showing a configuration of a portable telephone to which the bipolar transistor is applied.

FIG. 13 is a block diagram showing a configuration of a portable telephone system as one example of a communication system. The portable telephones (the apparatuses for communication) can be roughly classified into two parts, i.e., an RF (radio frequency) part and a BB (base band) part.

The BB part can be realized by the CMOS. On the other hand, for the RF part, the promotion of the high frequency in the frequency has advanced in both of the reception unit and the transmission unit, and at the present time, the RF part must process the analog signal having the frequency of several hundreds MHz to several GHz. Then, while at the present time, the compound semiconductor devices employing GaAs or the like are employed, such devices are inexpensive.

The bipolar transistor of the present invention can also process the analog signal having a frequency of several GHZ. Thus, the bipolar transistor of the present invention is applied to the RF part, whereby both of the RF part and the BB part can be manufactured on one chip. In addition, since the bipolar transistor of the present invention does not exert an influence on the CMOS manufacturing process at all, the present invention can readily cope with the scale down (shrink) of the CMOSs.

In addition, according to the structure of the bipolar transistor of the present invention, since the bipolar transistors having the different device withstanding voltages can be integrated through the same process, the high performance communication system can be realized between the signal processing unit and the power source unit, and between the analog unit and the digital unit without degrading the mutual characteristics.

Thirteenth Embodiment

Figure 14:
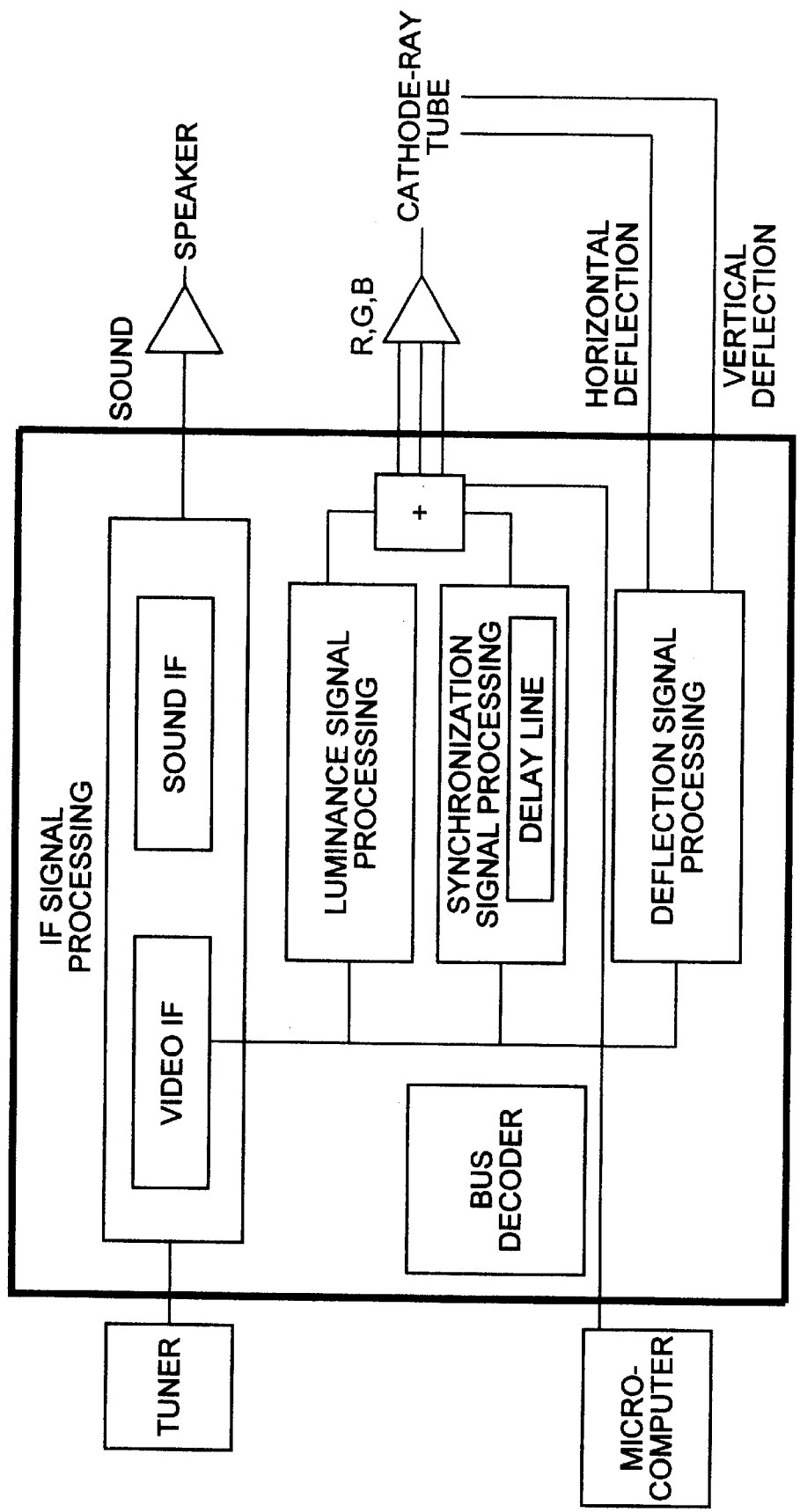
FIG. 14 is a block diagram showing a thirteenth embodiment of the present invention and showing a configuration of a part of a color television receiver to which the bipolar transistor is applied.

FIG. 14 is a block diagram showing a configuration of a part of a color television receiver. In the figure, a block diagram of one chip signal processing IC for a television is shown in the frame indicated by a heavy line. This IC is an IC for executing all of the analog processings for a small signal except a tuner unit. While since the high speed processing and the high amplification factor are both required for the signal processing in this IC, the signal processing in this IC can be realized by employing the bipolar transistors, and the bus decoder, the delay line, the synchronous deflecting processing and the like are realized by employing the MOS transistors.

Therefore, the bipolar transistor of the present embodiment is applied to that IC, whereby the digital television receiver of the next generation for which the high speed analog processing is required due to the promotion of the high density of the scanning lines can be readily realized. Also, since the bipolar transistor of the present embodiment is readily manufactured together with the MOS transistor, that IC can be readily manufactured on one chip.

Fourteenth Embodiment

Figure 15:
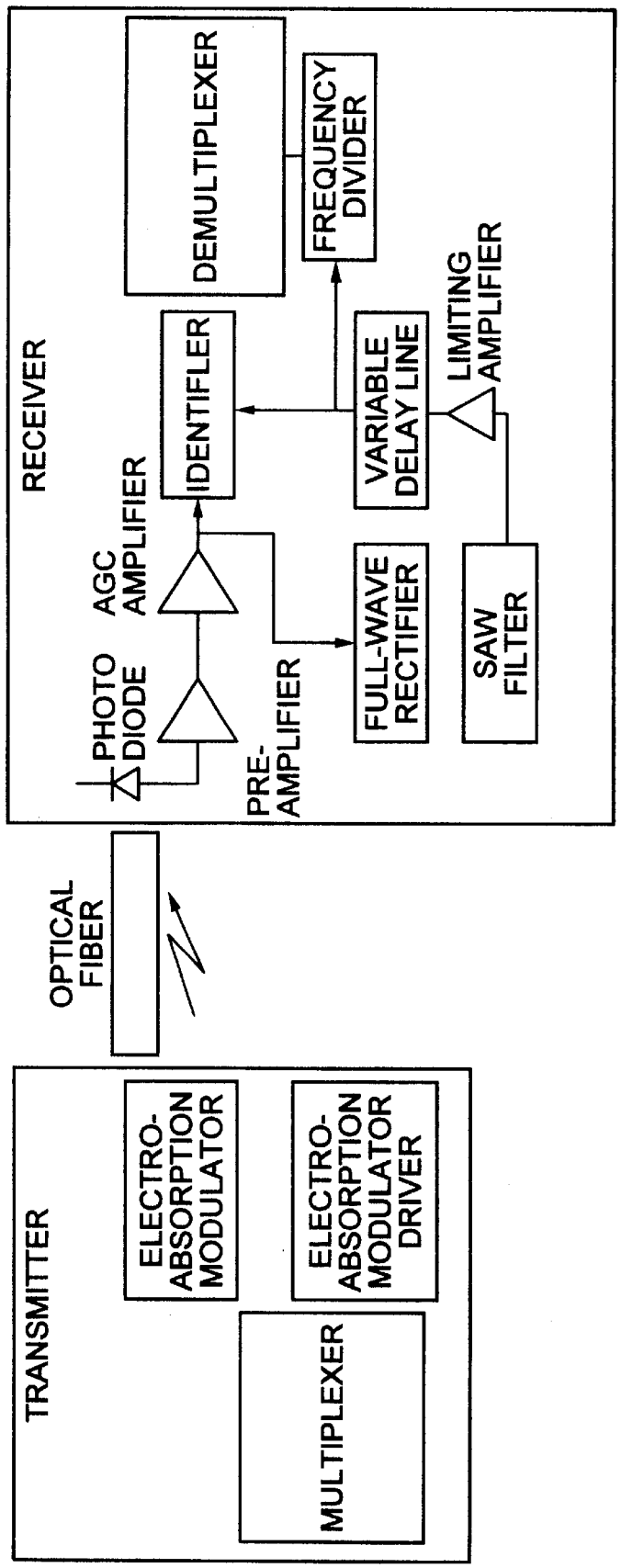
FIG. 15 is a block diagram showing a fourteenth embodiment of the present invention and showing a configuration of an optical transmission system to which the bipolar transistor is applied.

FIG. 15 is a block diagram showing a configuration of an optical transmission system. In order to cope with increasing of the amount of transmission information, for the optical transmission system is required the high speed analog signal processing. At the present time, this analog processing is realized by utilizing the compound semiconductor such as GaAs.

Since the bipolar transistor of the present embodiment is applied to the analog signal processing, whereby the optical transmission system can be constructed without employing any of the compound semiconductor devices, the promotion of the low cost can be realized. In addition, since the analog signal processing unit can be realized by utilizing the silicon device, each of the transmitter and the receiver can be manufactured on one chip.

According to the above-mentioned embodiments of the present invention, a lateral bipolar transistor which is a match in the device performance for a vertical bipolar transistor can be formed by utilizing an SOI substrate.

In addition, in the bipolar transistor of the above-mentioned embodiments, the distance of the collector drift region can be arbitrarily set, and hence an arbitrary-voltage withstanding bipolar transistor can be realized only by changing that distance.

What is claimed is:

1. A semiconductor device including a bipolar transistor comprising:

a collector electrode and an emitter electrode each of which is formed by filling with an electrically conductive material a trench formed in such a way as to pass through an opening between different portions of a field oxide film layer formed on a silicon-on-insulator (SOI) substrate including a semiconductor layer of a first conductivity type and to pass through an interlayer insulating film, used for separating an element forming region of said substrate from a first layer electrode thereabove, to reach a buried oxide film in said SOI substrate; and a base layer of a second conductivity type, different from said first conductivity type, which is formed along the trench for said emitter electrode, said base layer being formed in such a way as to extend from a surface of said SOI substrate and reach said buried oxide film in said SOI substrate.

2. A semiconductor device according to claim 1, further including a MOS transistor, wherein said bipolar transistor and said MOS transistor are formed on a same semiconductor chip.

3. A semiconductor device according to claim 2, wherein said electrically conductive material is a doped polycrystalline silicon film or a metallic film.

4. A semiconductor device according to claim 1, further including an insulated-gate bipolar transistor (IGBT), wherein said bipolar transistor and said IGBT are formed on a same semiconductor chip.

5. A semiconductor device according to claim 4, wherein said electrically conductive material is a doped polycrystalline silicon film or a metallic film.

6. A semiconductor device according to claim 1, further including a random access memory (RAM), wherein said bipolar transistor and said RAM are formed on a same semiconductor chip.

7. A semiconductor device according to claim 6, wherein said electrically conductive material is a doped polycrystalline silicon film or a metallic film.

8. A semiconductor device for use in a portable telephone, comprising a radio frequency unit having a receiving section and a transmitting section, and a base band unit, wherein said radio frequency unit includes the bipolar transistor as defined in claim 1.

9. A Semiconductor device according to claim 8,
wherein said electrically conductive material is a doped polycrystalline silicon film or a metallic film.

10. A semiconductor device including a bipolar transistor comprising:
an emitter electrode which is formed by filling a trench, said trench being formed in such a way as to pass through an opening between different portions of a field oxide film layer formed on a surface of a silicon-on-insulator (SOI) substrate including a semiconductor layer of a first conductivity type and to pass through an interlayer insulating film, used for separating an active surface of a region in which a device is intended to be formed from a first layer electrode or electrodes of layers lying thereabove, to reach a buried oxide film in said SOI substrate with an electrically conductive film or a metallic film; a base electrode of a second conductivity type, different from said first conductivity type, which is formed in such a way as to have a vertically uniform concentration distribution along said emitter electrode from the surface of said SOI substrate to said buried oxide film in said SOI substrate; and a collector electrode of said first conductivity type which is formed on the surface of said SOI substrate.

11. A semiconductor device according to claim 10, further including a MOS transistor,
wherein said bipolar transistor and said MOS transistor are formed on a same semiconductor chip.

12. A semiconductor device according to claim 10, further including an insulated-gate bipolar transistor (IGBT),
wherein said bipolar transistor and said IGBT are formed on a same semiconductor chip.

13. A semiconductor device according to claim 10, further including a random access memory (RAM),
wherein said bipolar transistor and said IGBT are formed on a same semiconductor chip.

14. A semiconductor device for use in a portable telephone, comprising a radio frequency unit having a receiving section and a transmitting section, and a base band unit, wherein said radio frequency unit includes the bipolar transistor as defined in claim 10.

15. A semiconductor device according to claim 10,
wherein said electrically conductive film is a doped polycrystalline silicon film.

* * * * *